United States Patent [19]

Stevenson, Jr.

[11] 4,126,867
[45] Nov. 21, 1978

[54] INK JET PRINTER DRIVING CIRCUIT

[75] Inventor: Richard G. Stevenson, Jr., Palo Alto, Calif.

[73] Assignee: Silonics, Inc., Sunnyvale, Calif.

[21] Appl. No.: 828,960

[22] Filed: Aug. 29, 1977

[51] Int. Cl.² ............................................. G01D 15/16
[52] U.S. Cl. .................................. 346/140 R; 310/317
[58] Field of Search ..................... 346/140 R; 310/317

[56] References Cited

U.S. PATENT DOCUMENTS

| | | | |
|---|---|---|---|
| 3,683,212 | 8/1972 | Zoltan | 346/140 R X |
| 3,946,398 | 3/1976 | Kyser | 346/140 R |
| 4,034,380 | 7/1977 | Isayama | 346/140 R |

FOREIGN PATENT DOCUMENTS 1,012,198  6/1977  Canada ............................... 346/140 R Primary Examiner—Joseph W. Hartary

[57] ABSTRACT

An electronic circuit for driving an ink jet print head of the type wherein a droplet of ink is ejected from an ink chamber through an orifice upon demand by pulsing a piezoelectric element in a manner to suddenly reduce the volume of the chamber. Switching circuits responsive to a low level control signal cooperatively energize the piezoelectric element for the duration of a control pulse and discharge the inherent capacitance of the crystal at the end of the control pulse. A storage capacitor is connected in a way to reduce the current drain on the power supply. Critical semi-conductor switching elements are provided with variable biases to maximize their switching speed.

8 Claims, 5 Drawing Figures

INK JET PRINTER DRIVING CIRCUIT

BACKGROUND OF THE INVENTION

This invention relates generally to the art of non-impact asynchronous ink jet printing, and more particularly to electronic driving circuits for ink jet print heads.

The ink jet print heads with which the driving circuit improvement of the present invention is best adapted for use are described in U.S. Pat. No. 3,946,398 — Kyser, et al. (1976) and co-pending patent application Ser. No. 489,985, filed July 19, 1974, both assigned to the assignee of the present application. A piezoelectric element is associated with an ink jet chamber in a manner that when the element is supplied a high voltage pulse it rapidly reduces the volume of the ink jet chamber, resulting in ejecting a droplet of ink from the orifice with sufficient velocity for it to travel to a recording medium. One such droplet forms a small portion of a character to be printed. A plurality, such as seven or nine, print heads of this type are preferably built as a single structure that is mechanically swept across a recording medium upon which the printing is taking place line by line. At each column of the printing line the appropriate number of the independently controllable ink jet chambers are fired by pulsing their respective piezoelectric elements to eject ink drops therefrom.

Aforementioned co-pending patent application Ser. No. 489,985 describes a basic drive circuitry. Canadian Pat. No. 1,012,198 is based on this pending U.S. application. U.S. Pat. No. 3,857,049 — Zoltan (1974) describes other driving circuits in ink jet printers. A general approach described therein is to utilize a low voltage control signal pulse to effectively switch a high voltage piezoelectric drive supply on and off in accordance with the pattern of ink droplets that are commanded to be ejected onto the recording medium.

It is a principal object of the present invention to provide such an ink jet piezoelectric element driving circuit that has an improved switching speed, reduced power supply voltage stability requirement and which operates with a reduced amount of power drain.

It is also an important object of the present invention to provide a drive circuit that operates a driven element in a manner to eject droplets of substantially the same size and with substantially the same velocity each time.

SUMMARY OF THE INVENTION

Briefly, according to one aspect of the present invention, the switching speed of three-terminal semi-conductor elements of the driving circuit is increased by biasing that semiconductor element in a manner to keep the current flow therethrough substantially constant. This is preferably accomplished by the use of another three-terminal semi-conductor element connected to sense the current through the switching semi-conductor element and adjust the bias of that element in a manner to keep the output current substantially constant absent any signal input. This assures maintenance of the semiconductor switching element out of the saturation state and prevents it from operating in a slow manner when it is commanded to switch. Fast switching of the high voltage supplied to the head is required for optimum ink droplet ejection as well as optimum ink flow into the ink chamber from an ink reservoir after a droplet is emitted.

According to another aspect of the present invention, the current drain on the power supply necessary to properly operate a piezoelectric element is reduced by the use of capacitive storage element connected in a manner to be charged from the power supply between operating pulses. The capacitive storage element is connected so that when the driver switches the power supply into connection with the piezoelectric element to emit a droplet of ink its capacitance is discharged through the element, thereby aiding the effort of the power supply.

In order to cause the piezoelectric element to return to its rest position after emitting a droplet of ink, the element itself must be provided a current discharge path since it has a great deal of inherent capacitance which stores electrical energy from the driving pulse. A second switching circuit is preferably provided to maintain this discharging current path for the element at all times except when the low voltage control pulse is received to command ejection of a droplet of ink. This also removes the discharging current path from draining off any of the energy applied to the element during its ink ejecting pulse.

Certain features of the present invention have been briefly outlined but other features, objects and advantages of the various aspects of the present invention are given in the following description of its preferred embodiments which should be taken in conjunction with the accompanying drawings.

DESCRIPTION OF THE PREFERRED EMBODIMENTS

Figure 1:
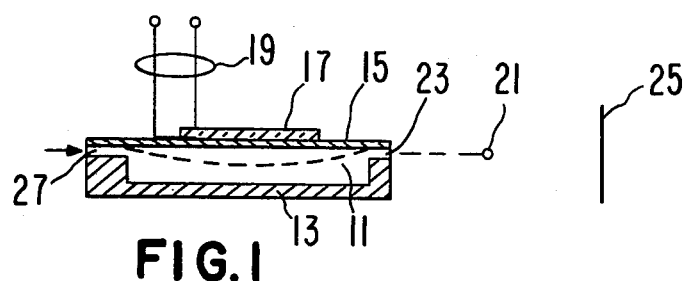
FIG. 1 illustrates generally the type of asynchronous ink jet printer with which the improved electronic driving circuit of the present invention is utilized.

Referring to FIG. 1, a single channel of an asynchronously driven ink jet print head will be generally explained. An ink chamber 11 is formed of an etched bottom plate 13 and a first, thin top plate 15. Adhered to the top plate is a piezoelectric element 17. When the element 17 is energized through its electrical leads 19, the top plate 15 is caused to suddenly deform inward of the ink chamber 11 as shown in dotted outline. This causes an ink droplet 21 to be propelled from an orifice 23 to a writing medium 25. Ink is supplied to the chamber 11 from a reservoir through an opening 27. To operate properly, the element 17 must be driven through its conductors 19 in a manner to deflect fast enough to give the droplet of ink 21 sufficient energy to travel in a straight trajectory to the paper or other writing medium 25. Similarly, the element 17 must be allowed to return to the rest position shown and restore the chamber 11 to its full volume in a manner to be filled with ink and in a condition to eject the next droplet upon demand. The piezoelectric element 17 can be of a ceramic or crystal type.

Figure 2:
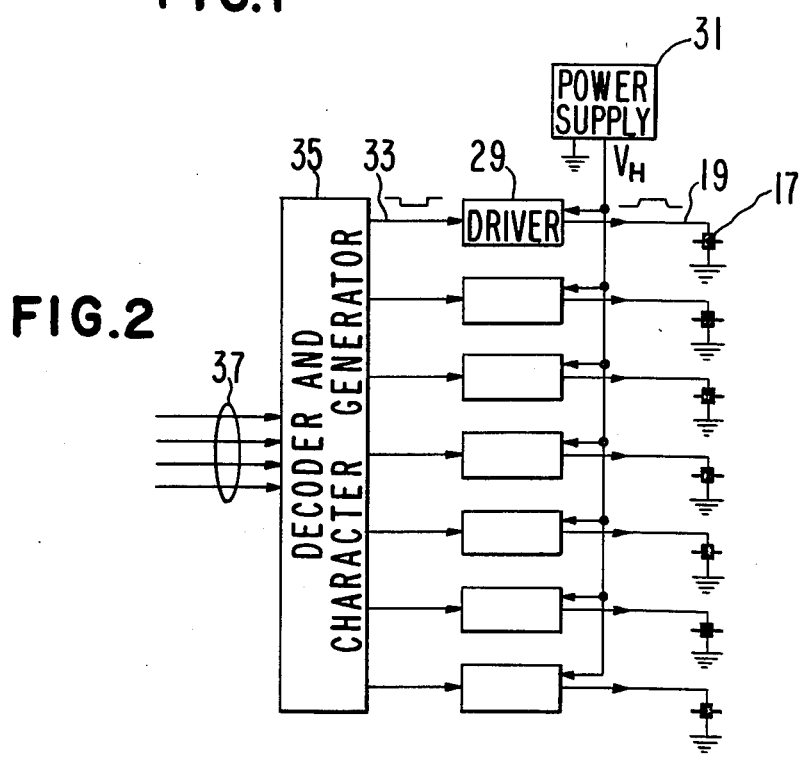
FIG. 2 illustrates in block diagram form the main components of a driving circuit for a seven channel ink jet print head.

The principal application for such a device is in forming alpha-numeric characters line by line on a printing medium as an alternative to existing impact printers. Several independently controllable ink jet channels are preferably combined into a single printing head so that a complete line of characters can be formed in a single pass of the print head across the writing medium. A plurality of ink jet channels, such as seven or nine conforming to existing dot matrix standards, can be formed in a column that is swept across the writing medium, for example. FIG. 2 illustrates schematically a seven channel system each having its own independently controlled drive, such as the element 17 for a single channel. Each channel element also has its own driving circuit, such as the driving circuit 29 for one of the channels. Each of the drivers is powered by a power supply 31. Each drive, in effect, switches the output $V_H$ across its associated drive element in response to a low level control pulse being received by the driver circuit at its input, such as the circuit 33 illustrated in FIG. 2 for one of the channels. The low level control pulses applied to the driver circuits are developed in seven independent lines, the line 33 being one of them, by a decoder and character generator electronic circuit 35. These control pulses are developed in accordance with binary signals in input lines 37 so that droplets are ejected in an appropriate pattern depending on the position of the head across the writing medium and the characters to be formed thereon. The physical structure of such ink jet printing heads is described in more detail in aforementioned U.S. Pat. No. 3,946,398 and in Canadian Pat. No. 1,012,198, issued June 14, 1977. Each of these patents also disclose general approaches for driving circuits for the individual channel piezoelectric elements.

Figure 5:
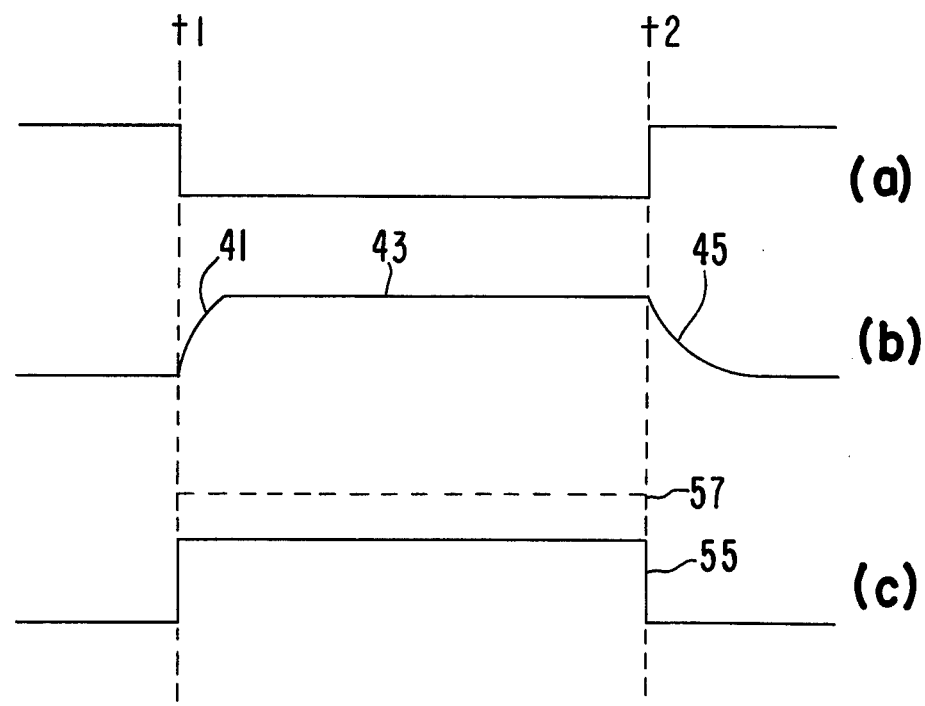
FIG. 5 illustrates voltage waveforms at various points of the circuits illustrated in FIGS. 2, 3 and 4.

The desired control pulse inputted to each of the drivers, such as the pulse in the line 33, is shown in FIG. 5(a). This low voltage control signal causes a high voltage output in the line 19 in the form of the voltage waveform shown in FIG. 5(b). Referring to FIG. 5, at time *t1* the driver circuit 29 (FIG. 2) swithes on the power supply voltage $V_H$ to the element 17. Because of an inherent capacitance of the element 17, there is a short period of time required, as indicated by the portion 41 of the curve of FIG. 5(b), for the voltage across the element 17 to build up to its steady state value indicated by the portion 43. The time constant of the circuit, and thus the rise time in the region 41 of FIG. 5(b), is determined by the amount of resistance in series with the capacitance of the element 17. Therefore, the rise time can be adjusted and this also adjusts the rate of deflection of the plate 15 into the ink jet chamber 11 (FIG. 1).

Similarly, at time *t2* of FIG. 5, when the voltage $V_H$ is disconnected from the crystal 17, the capacitance of the drive element will remain charged and will not return to its rest position until discharged. Therefore, a resistance discharge path is necessary, the resistance of which determines the time constant of the portion 45 of the curve of FIG. 5(b). This then determines the rate of speed at which the top plate 15 returns to its rest position (FIG. 1).

Figure 3:
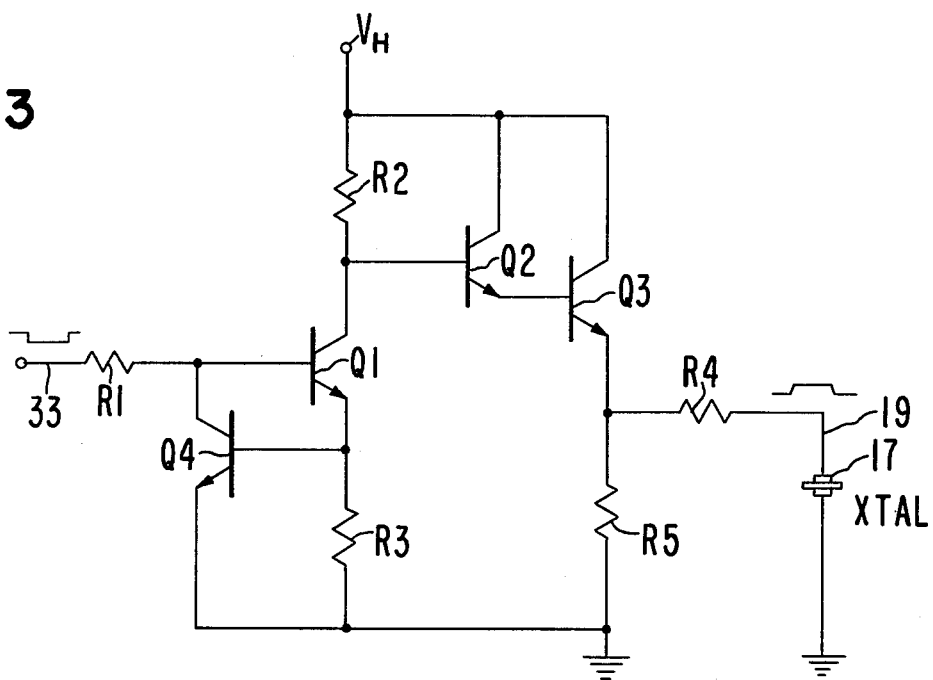
FIG. 3 is a schematic diagram of an electronic circuit for driving a single channel, according to the present invention.

Referring to FIG. 3, the schematic diagram of a driving circuit embodying certain aspects of the present invention is given. This circuit can form the driver 29 of FIG. 2 and is then repeated for each of the other drivers of a multi-channel head. The control pulse received at the input line 33 encounters an input resistance R1 before being applied to a control element of a three-terminal semiconductor device, the base of a transistor Q1. The collector of the transistor Q1 is connected through a resistance R2 to the high voltage supply $V_H$. The emitter of the transistor Q1 is connected through a resistance R3 to ground potential. The transistor Q1 operates as a switch. It is normally conductive, a current then flowing between the power supply $V_H$ and ground potential through the series circuit of R2, the power terminals of the transistor Q1 (collector and emitter) and the resistance R3. When a negative going, low voltage control pulse is received in the line 33, the transistor Q1 is turned off so that that current flow ceases. The collector of the transistor Q1 then rises in voltage to something near that of the power supply voltage $V_H$. The transistor Q1 thus operates to turn on the high voltage supply $V_H$ to subsequent circuits. At the end of the control pulse in the input line 33, the transistor Q1 turns on again and its output voltage at its collector then drops back to its steady state condition.

This output of the transistor Q1 is amplified by a combination of transistors Q2 and Q3. The collector of the transistor Q1 is connected directly to the base of a transistor Q2. The collector of the transistor Q2 is connected to the voltage $V_H$ and its emitter is connected directly to the base of the transistor Q3. The collector of the transistor Q3 is also connected to the power supply voltage $V_H$ and its emitter is connected through resistance R4 to the element 17. A second resistance R5 is connected between the emitter of the transistor Q3 and ground potential.

The time constant of the element 17 is determined by its inherent internal capacitance and the series resistance R4. This time constant affects how fast the element 17 contacts after first receiving the leading edge of the control pulse in the line 33, as discussed previously. The transistors Q2 and Q3, effecting a power amplifier, remain on for the duration of the control pulse in line 33. At the trailing edge of that control pulse, the transistors Q2 and Q3 turn off, thereby removing the voltage from the element 17. The discharge time constant of the element 17 is thus determined by its capacitance and the resistance path across it which formed of series resistances R4 and R5. Thus, the value of the resistance R5 is set to determine how fast the element 17 capacitance discharges and thus the rate of speed at which it returns from its deflected to its non-deflected state, as discussed previously.

In such a driving circuit, it is desired that the clean, sharp nature of the control pulse at the input line 33 be maintained so that the element 17 sees a clean voltage pulse from the high voltage supply $V_H$ as well. In order to accomplish this, it has been found desirable to bias the switching transistor Q1 in an unique manner in order to maintain operation of the transistor Q1 out of a saturation state. This is accomplished by use of a transistor Q4 with its base connected directly to the emitter of the transistor Q1. Its collector is connected to the base of the transistor Q1 and the emitter of the transistor Q4 is connected to ground potential. In effect, the voltage drop in the resistance R3 resulting from the current flow through the transistor Q1 is amplified by the transistor Q4 and is fed back to the base of Q1 and biases it. The result is that the current through R3 is maintained at a substantially constant level since any time it deviates from that level, the feedback through the transistor Q4 adjusts the conductivity of the transistor Q1 to return the current through it to the desired level. The value of the current so flowing when the transistor Q1 is turned on is set by adjusting the value of the resistance R3. The feedback transistor Q4 will maintain that value. It is then disired that the voltage drop between the collector and the emitter of the transistor Q1 remain above its saturation voltage and this is accomplished by selection of the proper resistance for the resistor R2.

The power amplifier circuit composed of the transistors Q2 and Q3 are connected in a manner that saturation is not possible so such a feedback biasing arrangement as provided for the transistor Q1 is not required. It will be noted in the particular circuit example of FIG. 3 that all the transistors are of an NPN type and that it is designed to operate with a negative going control pulse at its input line 33. If a positive going input control pulse were desired to be used, the main change of the circuit of FIG. 3 would be the substitution for the transistors Q2 and Q3 a single PNP transistor with its emitter connected to the voltage supply $V_H$ and its collector connected to the resistance R4 and R5. The base would not be directly connected to the collector of Q1 but through an additional resistor.

Particular parameters for one circuit in the form of that shown in FIG. 3, are as follows:

The piezoelectric element 17: barium-titanate ceramic
  The level of $V_H$: 120 volts DC
  Levels of the Input Control Pulse: 0 to 5 volts DC
  R1: 470 ohms
  R2: 51k ohms
  R3: 270 ohms
  R4: 4.7k ohms
  R5: 10k ohms
  Q1: MPS DO1
  Q2: MPS DO1
  Q3: MPS DO1
  Q4: 2N3904

Figure 4:
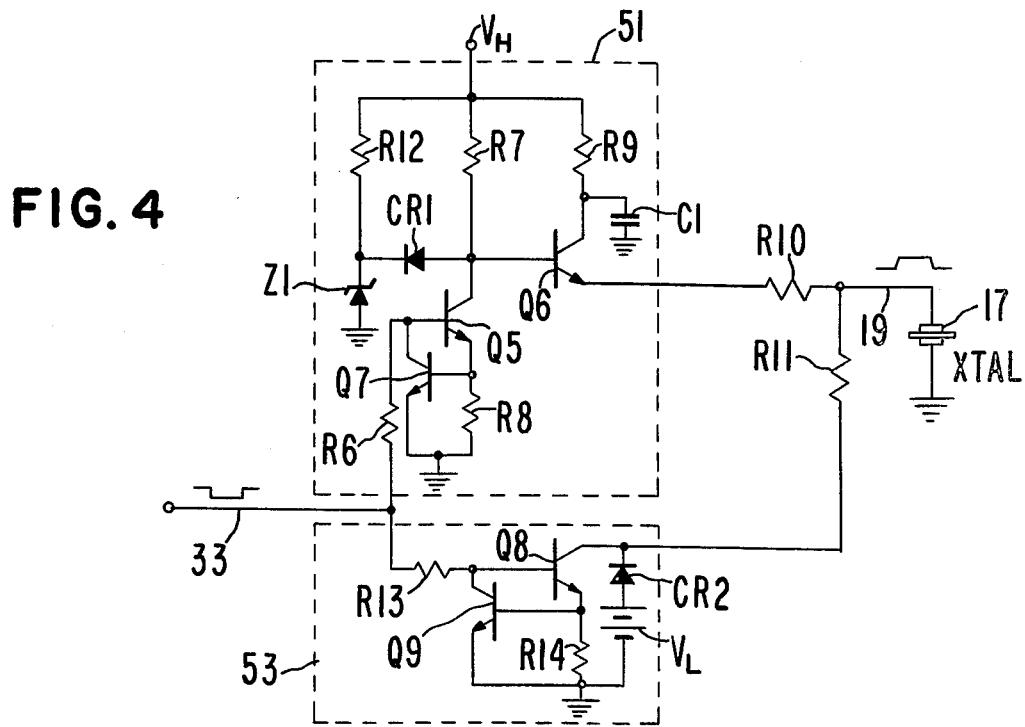
FIG. 4 is a schematic diagram of another electronic circuit for driving a single channel, according to the present invention.

Referring to FIG. 4, another specific channel driving circuit is illustrated and which embodies additional aspects of the present invention. A switching circuit 51 responsive to the control pulse in the line 33 connects the high voltage $V_H$ to the element 17 for the duration of the control pulse, in a manner similar to that described with respect to FIG. 3 but including additional features. The switching circuit 51 applies the high voltage to the element 17 through a series resistance R10. In addition, a second switching circuit 53, also responsive to the control pulse in the input line 33, controls the discharge of the capacitance of the element 17 through a series resistance R11 to ground potential. The switch circuits 51 and 53 are designed so that the circuit 51 is in an "on" state for the duration of the control pulse in the line 33 while remaining "off" at all other times. Conversely, the discharge switching circuit 53 is designed so that it is in its "on" state at all times other than during a control pulse at the input 33, the circuit 53 being turned off for the duration of such a control pulse. The disconnecting of the discharge resistor R11 for the duration of the control pulse is different than that of the circuit of FIG. 3 wherein a discharge resistor R5 remains in the circuit even during the control pulse.

In the switching circuit 51 of FIG. 4, the input signal in the line 33 is passed through a series resistance R6 to the base of a transistor Q5. The collector of the transistor Q5 is connected to a high voltage $V_H$ by a series resistance R7. The emitter of the transistor Q5 is connected in series with the resistance R8 to ground potential. The elements Q5, R7 and R8 correspond, respectively, to elements Q1, R2 and R3 of FIG. 3. Similarly, a transistor Q7 of FIG. 4 is connected to control the bias of the switching transistor Q5 in the same manner that the transistor Q4 is utilized in the circuit of FIG. 3 to control the bias of the switching transistor Q1. The function of these components in the switching circuit of FIG. 4 will not be repeated since their operation is the same as described previously.

The switched high voltage $V_H$ is applied from the collector of the transistor Q5 to the base of an amplifying transistor Q6 whose emitter is then connected in series with the resistance R10 to the element 17. The collector of the transistor Q6 is connected to the high voltage power supply $V_H$ through a series resistance R9.

A voltage regulator circuit is additionally provided in the switching circuit of FIG. 4, the principal operative element being a Zener diode Z1. The diode Z1 is connected in series between ground potential and the high voltage supply $V_H$ through a resistance R11. The base of the transistor Q6 amplifier is connected through a diode CR1 to the junction between the Zener diode Z1 and its series resistance R12. The result is that the base of the transistor Q6 is provided with substantially the same voltage each pulse, as can be best explained with reference to FIG. 5(c) which is an illustration of the voltage waveform at the base of the transistor Q6 for the duration of an input control pulse. The solid pulse line 55 shows the amplitude to which the base of the transistor Q6 is permitted to rise. The output at the collector of the transistor Q5 would normally go to the voltage level 57 shown in dashed outline in FIG. 5(c) if the voltage regulating circuit including the Zener diode Z1 were not present. The maximum voltage 55 that the base of the transistor Q6 is permitted to attain is thus carefully controlled, resulting in consistency of size and velocity of ink droplets ejected from the chamber because its associated element 17 is caused to deflect inward with the same characteristics at the beginning of each control pulse. A single voltage control circuit may be, if desired, provided for all seven of the driving circuits illustrated in FIG. 2 rather than having a separate control for each circuit.

The switching circuit 51 of FIG. 4 includes a capacitor C1 which is not present in the previously described circuit of FIG. 3. The capacitance C1 is connected between the collector of the transistor Q6 and ground potential. Or, to state it another way, the capacitance C1 is connected in parallel with the series circuit of the transistor Q6, resistor R10 and element 17. The result is that the capacitance C1 charges from the voltage supply $V_H$ when no control pulse is present at the input 33. This is because during that time the transistor Q6 is off and presents a very high impedance circuit in the path parallel to that of the capacitor C1. But during a control pulse in the line 33, the path parallel to that of the capacitor C1 has a finite, low impedance because transistor Q6 is then in its conductive state. The result is that the capacitance C1 discharges through that parallel path and thus helps provide energy to the element 17 at the initial portion of a control pulse in the line 33. This has an advantage of reducing the amount of current that needs to be drawn from the voltage supply $V_H$ during a control pulse. The resistance R9 may then be increased to reduce that current. And, of course, the capacity of the power supply of the voltage $V_H$ is reduced.

In order to make maximum use of the discharge of the capacitance C1 during a control pulse and also to further reduce the current requirements of the voltage $V_H$ supply source, the crystal capacitance discharge resistance R11 is disconnected during the control pulse by the switching circuit 53. If the resistance R11 remains connected to ground during the control pulse, some current will flow therethrough from the supply $V_H$ and the charge on the capacitor C1 without performing any useful work.

The control pulse in the line 33 is applied to the switching circuit 53 through a series resistance R13 and thence to the base of a switching transistor Q8. The collector of the transistor Q8 is connected to the resistance R11 and its emitter is connected to ground potential through a series resistance R14. A biasing feedback transistor Q9 is provided with its base connected to the emitter of the transistor Q8 and its collector connected to the base of the transistor Q8. The emitter of the feedback transistor Q9 is connected to ground potential. The transistor Q9 is provided to maintain switching speed of the transistor Q8, as described hereinabove with respect to the cooperating transistors Q1 and Q4 of FIG. 3. The transistor Q8 is turned off by the negative going control pulse in the line 33. The transistor Q8 is turned on at all other times. A voltage supply $V_L$ and diode CR2 are connected in series between the collector of the transistor Q8 and grund potential in order to provide operating voltage for the transistor Q8 in the absence of a control pulse during which transistor Q6 is turned off disconnecting the transistor Q8 from the voltage supply $V_H$.

Particular parameters for one circuit in the form of that shown in FIG. 4, are as follows:

The piezoelectric element 17: barium-titanate ceramic
The level of $V_H$: 145°–185 volts
The level of $V_L$: 2.5–5 volts
Levels of the input control pulse: 0 to 5 volts DC
R6: 1000 ohms
R7: 33k ohms
R8: 270 ohms
R9: 33K ohms
R10: 4.7k ohms
R11: 11k ohms
R12: 33k ohms
R13: 1000 ohms
R14: 47 ohms
Q5: MPS DO1
Q6: MPS DO1
Q7: 2N3904
Q8: MPS DO1
Q9: 2N3904
C1: 0.22 $\mu f$
Z1: 1N5273$\beta$
CR1: 1N3070
CR2: 1N3070

The various aspects of the present invention have been described with respect to particular embodiments thereof, but it will be understood that the invention is entitled to protection within the full scope of the appended claims. Two particular circuits have been described for providing fast and accurate control over the timing of the crystal pulse. This is important to prevent skew between channel firings which affects print quality.

I claim:

1. An ink jet printer capable of ejecting a drop of ink upon demand in response to a control pulse, comprising:
   an ink chamber having an orifice through which said ink droplet is expelled,
   a piezoelectric element cooperatively installed in conjunction with said chamber for suddenly reducing its volume to expel a droplet through said orifice upon being connected to a voltage source,
   means receiving said control pulse for connecting said element to said voltage source for the duration of said control pulse, said connecting means including a three-terminal semi-conductor device connected to change between conductive and non-conductive states through two terminals in response to the control pulse being applied to a third control terminal, and
   means connected between one of said two terminals and the control terminal of said switching device for applying to the control terminal a bias voltage level proportional at any instant to the level of current through said semi-conductor device between its said two terminals, thereby permitting said device to be maintained out of a saturation state, whereby the switching speed of the device is kept high.

2. The ink jet printer according to claim 1 wherein said bias means includes a second three-terminal semi-conductor device connected with its control terminal connected to one of said two terminals of the first semi-conductor device and one of two output terminals of the second device connected to the control terminal of the first device.

3. An ink jet printer capable of ejecting a drop of ink upon demand in response to a control pulse, comprising:
   an ink chamber having an orifice through which said ink droplet is expelled,
   a piezoelectric element cooperatively installed in conjunction with said chamber for suddenly reducing its volume to expel a droplet through said orifice upon being connected to a voltage source, said element characterized by a significant amount of electrical capacitance,
   switching means receiving said control pulse for connecting said element to said voltage source for the duration of said control pulse,
   electrical storage means cooperatively connected with said switching means for being charged from said voltage source in the absence of said control pulse and for combining in parallel with said voltage source during the control pulse in a manner to be discharged through said element, and
   means responsive to said control pulse for providing a current path across said element absent a control pulse while disconnecting said current path during a control pulse, whereby the capacitance of said element is discharged in the absence of a control pulse but without affecting operation of the element during a control pulse.

4. The ink jet printer according to claim 3 wherein said switching means comprises:
   a three-terminal semi-conductor device connected to charge between conductive and non-conductive states through two terminals in response to the control pulse being applied to a third control terminal, and
   means connected between one of said two terminals and the control terminal of said switching device for applying to the control terminal a bias voltage level proportional at any instant to the level of current through said semi-conductor device between its said two terminals, thereby permitting said device to be maintained out of a saturation state, whereby the switching speed of the device is kept high.

5. For an ink jet printer including an ink chamber with an orifice through which an ink droplet may be expelled, a reservoir of ink in fluid communication with said chamber, a piezoelectric element operably held by said chamber in a manner to suddenly reduce its volume to expel a droplet of ink through the orifice of the chamber upon being connected to a two terminal voltage source and in a manner to return the chamber to its initial volume upon being disconnected from the voltage source, an electronic circuit for connecting said piezoelectric element to said voltage source for the duration of an ink ejecting control pulse, comprising:

means connected to one of said voltage supply terminals for limiting maximum current that can be drawn from said voltage supply, a resistance connected in series with said element and to said other power supply terminal, means responsive to said ink ejecting control pulse for connecting said series resistance and piezoelectric element to said current limiting means for the duration of said control pulse, thereby to connect said element in a series circuit across the two terminals of the voltage source for the duration of said pulse, whereby the element reduces the volume of the ink chamber to eject a droplet therefrom, means connected between said current limiter and said another terminal of said voltage supply for storing electrical energy, whereby said storage means is charged from said voltage source in the absence of a control pulse and discharges to said element when said connecting means is closed, and means responsive to an absence of a control signal for providing a current path across said element, thereby to control the discharge of an inherent capacitance of said element at the end of an ink ejecting control pulse.

6. The ink jet printer electronic driving circuit according to claim 5 wherein said connecting means comprises:

a three-terminal semi-conductor switching element having two power terminals connected to said current limiter and to said series resistance and crystal circuit, respectively, means receiving said ink ejecting control pulse for amplifying it and applying it to a third control element of said semi-conductor switching device, and means including a non-linear semi-conductor current path between said control element and a reference potential for controlling the voltage that is applied thereto to a predetermined level, thereby to provide a controlled voltage to said element during the duration of said ink ejecting control pulse, whereby droplets of uniform size and velocity are repetitively ejected from said ink jet chamber orifice in response to successive control pulses.

7. The ink jet printer connecting circuit according to claim 5 wherein said connecting means comprises:

a first three-terminal semi-conductor device having two power terminals connected to said current limiting device and to said series resistance and crystal circuit, respectively, for connecting the circuits together in response to a sufficient control signal applied to a control terminal of the device, and an amplifying circuit receiving said control signal for application to said control terminal of said first device, said amplifying circuit comprising second and third three-terminal semi-conductor devices, the second device connected in an emitter follower mode between receiving the control pulse and the control terminal of said switching element, the third device being connected from the output of the second device to the control pulse carrying input of the second device in a negative feedback mode in a manner to continuously bias the first semi-conductor device in a nonsaturated state, whereby said amplifying circuit provides quick response to the incoming control pulse.

8. The ink jet printer electronic circuit according to claim 7 wherein said switching means for discharging the piezoelectric element capacitance comprises:

a fourth three-terminal semi-conductor device connected in an emitter follower mode across said element in a series with resistances, a control element of said semi-conductor device being connected to receive said control pulse, and a fifth three-terminal semi-conductor device connected in an emitter follower mode across said element in series with resistances, a control element of said semi-conductor being connected to receive said control pulse.

* * * * *